(12) United States Patent
Arnborg

(10) Patent No.: US 7,397,108 B2
(45) Date of Patent: Jul. 8, 2008

(54) BIPOLAR TRANSISTOR

(75) Inventor: Torkel Arnborg, Stockholm (SE)

(73) Assignee: Infineon Technologies AG, Munich (DE)

( * ) Notice: Subject to any disclaimer, the term of this patent is extended or adjusted under 35 U.S.C. 154(b) by 434 days.

(21) Appl. No.: 11/078,682

(22) Filed: Mar. 11, 2005

(65) Prior Publication Data
US 2005/0205967 A1 Sep. 22, 2005

(30) Foreign Application Priority Data
Mar. 12, 2004 (EP) .................................. 04005895

(51) Int. Cl.
*H01L 27/082* (2006.01)
(52) U.S. Cl. ................. 257/565; 257/573; 257/583; 257/593; 257/E21.372
(58) Field of Classification Search ................. 257/565, 257/573, 583, 593, E21.372
See application file for complete search history.

(56) References Cited

U.S. PATENT DOCUMENTS

| 5,003,365 | A | * | 3/1991 | Havemann et al. | .......... 257/514 |
| 5,087,580 | A | | 2/1992 | Eklund | |
| 5,587,599 | A | * | 12/1996 | Mahnkopf et al. | .......... 257/370 |
| 5,629,547 | A | | 5/1997 | Chambers et al. | |
| 6,979,884 | B2 | * | 12/2005 | Ahlgren et al. | ............. 257/588 |
| 2001/0019872 | A1 | | 9/2001 | Havemann | |
| 2002/0020852 | A1 | * | 2/2002 | Huang | ......................... 257/197 |
| 2003/0062589 | A1 | | 4/2003 | Babcock et al. | |

FOREIGN PATENT DOCUMENTS

WO       WO 03/063224 A1       7/2003

OTHER PUBLICATIONS

Cai et al., "Vertical SiGe-Base Bipolar Transistors on CMOS-Compatible SOI Substrate", Proceedings of the 2003 Bipolar/BiCMOS Circuits and Technology Meeting, pp. 215-218, (4 page).
Ouyang et al., "A Simulation Study on Thin SOI Bipolar Transistor with Fully or Partially Depleted Collector", Proceedings of the 2002 Bipolar/BiCMOS Circuits and Technology Meeting, pp. 28-31, (4 page).

* cited by examiner

*Primary Examiner*—Jerome Jackson
*Assistant Examiner*—José R Diaz
(74) *Attorney, Agent, or Firm*—Maginot, Moore & Beck

(57) ABSTRACT

A monolithically integrated bipolar transistor has an SOI substrate, a collector region in the SOI substrate, a base layer region on top of and in contact with the collector region, and an emitter layer region on top of and in contact with the base layer region, wherein the collector, base layer, and emitter layer regions are provided with separate contact regions. Further, a region of an insulating material, preferably an oxide or nitride, is provided in the base layer region, in the emitter layer region, or between the base and emitter layer regions, wherein the insulating region extends laterally at a fraction of a width of the base and emitter layer regions to reduce an effective width of the bipolar transistor to thereby eliminate any base push out effects that would otherwise occur.

15 Claims, 2 Drawing Sheets

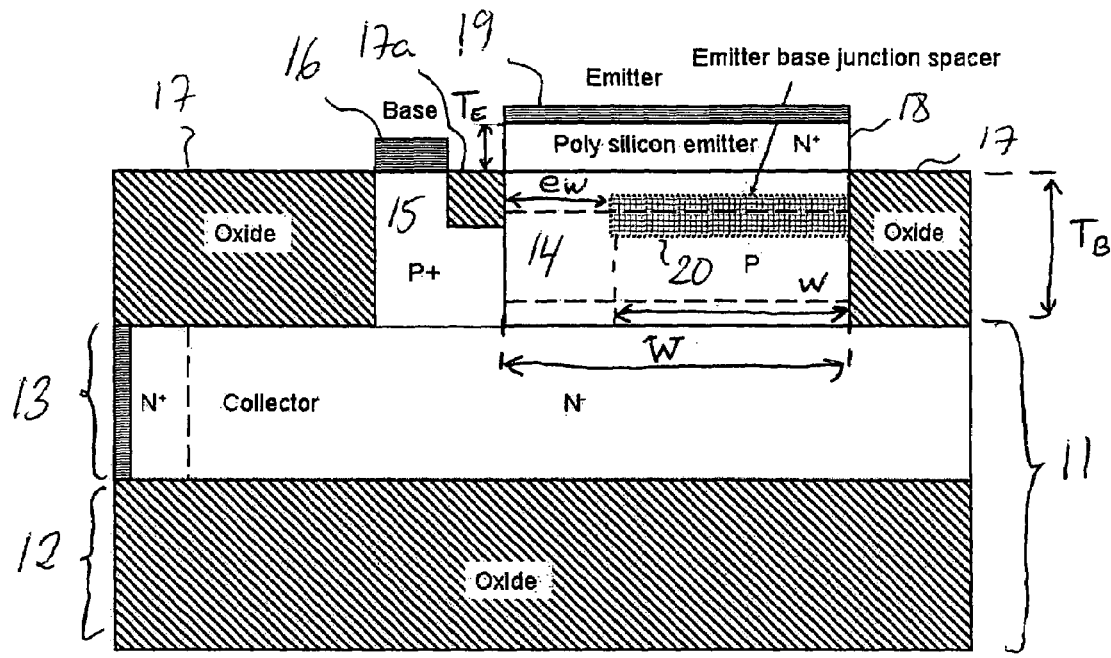
Fig. 1
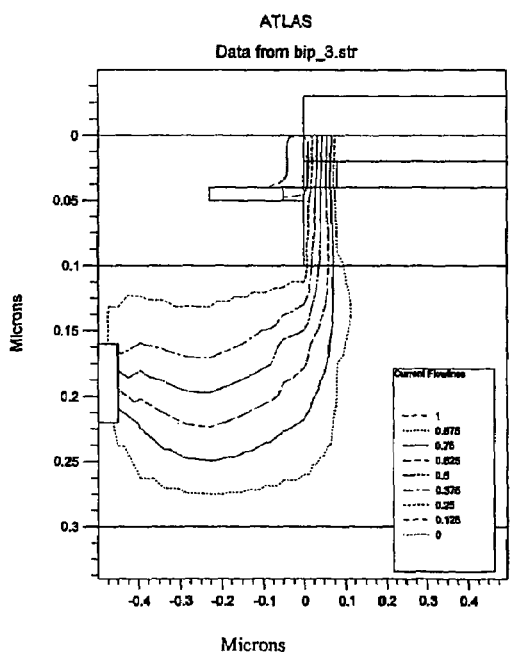 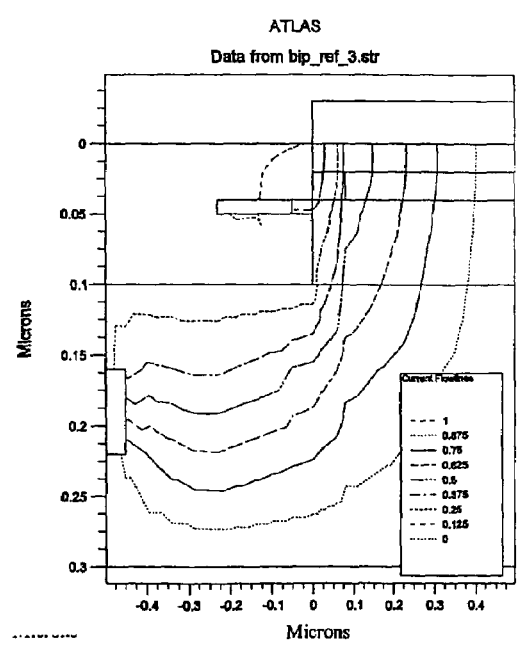
Fig. 2a Fig. 2b

BIPOLAR TRANSISTOR

CROSS-REFERENCE TO RELATED APPLICATION

This application claims priority from European Patent Application No. 04005895.0, filed on Mar. 12, 2004, and is incorporated herein by reference in its entirety.

BACKGROUND OF THE INVENTION

1. Field of the Invention

The present invention generally relates to the field of integrated circuit technology, and more specifically the invention relates to a monolithically integrated bipolar transistor on an SOI (Silicon-On-Insulator) substrate.

2. Description of Related Art

Bipolar transistors in SOI technologies using thin silicon layers are often designed by means of a vertical emitter-base structure and a lateral collector structure, see e.g. U.S. Pat. No. 5,087,580 to Eklund, and J. Cai et al., Vertical SiGe-Base Bipolar Transistors on CMOS-Compatible SOI Substrate, p. 215 in Proceedings of the 2003 Bipolar/BiCMOS Circuits and Technology Meeting.

Depending on the geometry, this design may be limited by base push out effects, also called the Kirk effect, as shown by Q. Ouyang et al., A Simulation Study on Thin SOI Bipolar Transistors with Fully or Partially Depleted Collector, p. 28 in Proceedings of the 2002 Bipolar/BiCMOS Circuits and Technology Meeting. The base push out is strongly affected by the oxide layer of the SOI substrate beneath the transistor. In a standard transistor the base push out would just continue down towards the collector. However the oxide interface prevents all transport and the entire collector layer becomes flooded with carriers, giving a slower transport. This is seen as a hook in a Gummel plot and as a dip in the transition frequency, $f_T$.

As pointed out by Q. Ouyang et al., a common manner to reduce the base push out is to shrink the emitter width or to increase the doping concentration in the collector region. However, the shrinking of the emitter may be prevented by the minimum feature sizes allowable by the lithography of the particular fabrication process used.

SUMMARY OF THE INVENTION

It is an object of the present invention to provide a monolithically integrated bipolar transistor on an SOI (Silicon-On-Insulator) substrate, wherein base push out effects are eliminated, or at least severely reduced.

It is in this respect a particular object of the invention to provide such a bipolar transistor, wherein an effective width of the bipolar transistor is less than the minimum feature size permissible by the lithography of the process used for fabrication of the bipolar transistor.

It is a further object of the invention to provide such a bipolar transistor, which is a vertical-lateral transistor adapted for thin, e.g. less than 200 nm thick, SOI substrates.

It is yet a further object of the present invention to provide such a bipolar transistor, which can be fabricated in a known bipolar or BiCMOS SOI process without adding any additional process steps, or by adding a few process steps only to the process.

Still further, it is an object of the invention to provide an integrated circuit comprising a bipolar transistor fulfilling the above-identified objects.

According to a first aspect of the present invention, there is provided a monolithically integrated bipolar transistor having an SOI (Silicon-On-Insulator) substrate, a collector region in the SOI substrate, a base layer region on top of and in contact with the collector region, and an emitter layer region on top of and in contact with the base layer region, wherein the collector, base layer, and emitter layer regions are provided with separate contact regions. Further, a region of an insulating material is provided in the base layer region, in the emitter layer region, or between the base and emitter layer regions, wherein the region of the insulating material extends laterally at a fraction of a width of the base and emitter layer regions to reduce an effective width of the bipolar transistor.

If the insulating region, which may be an oxide or a nitride, is provided within the base layer region, or within the emitter layer region, it is advantageously provided at a distance from the base-emitter interface, which is less than about half the thickness of the layer region in which it is provided.

The region of the insulating material may be an etched region filled with insulating material. Thus, the emitter can be lithographically defined, whereas the insulating region can have a sub-lithographically defined lateral dimension.

According to a second aspect of the present invention, there is provided an integrated circuit having the above-described bipolar transistor.

BRIEF DESCRIPTION OF THE DRAWINGS

Further characteristics of the invention and advantages thereof will be evident from the detailed description of preferred embodiments of the present invention given hereinafter and the accompanying FIGS. 1-4, which are given by way of illustration only, and are thus not limitative of the present invention.

FIG. 1 is a highly enlarged cross-sectional view of a partially processed bipolar transistor according to a preferred embodiment of the present invention.

FIGS. 2a-b illustrate current streamlines for the inventive bipolar transistor of FIG. 1 (FIG. 2a), and for a conventional prior art bipolar transistor (FIG. 2b).

DETAILED DESCRIPTION OF PREFERRED EMBODIMENTS

Figure 3:
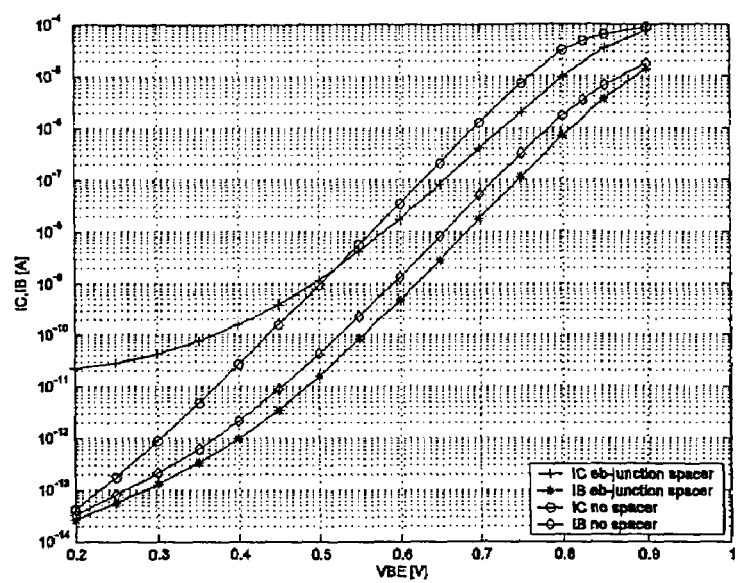
FIG. 3 is a Gummel plot for the inventive bipolar transistor of FIG. 1 and for a conventional prior art bipolar transistor.

A partially processed monolithically integrated bipolar transistor according to a preferred embodiment of the present invention is shown in FIG. 1 in cross section. A common SOI structure substrate 11 comprises a buried silicon oxide layer 12 and a monocrystalline silicon layer thereupon. The monocrystalline silicon layer is a thin layer and may have a thickness of less than about 200 nm.

The inventive bipolar transistor comprises a lateral collector region 13 doped to $N^-$ and $N^+$ in the monocrystalline silicon layer of the SOI structure substrate 11, an essentially planar P-type doped intrinsic base layer region 14 thereon, and finally an essentially planar $N^+$-type doped emitter layer region 18 thereon. The collector 13, base layer 14, and emitter layer 18 regions are provided with separate contact regions.

The collector comprises an $N^+$-type doped collector contact region, which contacts the collector to e.g. the upper surface of the structure (not illustrated). The P-type doped base layer region 14 is connected to a $P^+$-type doped base contact region 15, to which in turn a metallic base contact 16 is provided. The base is surrounded by an oxide region 17 or other region of insulating material, and another insulating region 17a is formed between the P-type doped base layer region 14 and the P⁺-type doped base contact region 15 in order to avoid any short circuit between the P⁺-type doped base contact region 15 and the N⁺-type doped emitter layer region 18. A metallic emitter contact 19 is provided for contact to he N⁺-type doped emitter layer region 18.

According to the present invention, a region or spacer 20 of an insulating material, e.g. an oxide or nitride, is provided in the emitter window of the structure. The insulating region 20 is located in the base layer region 14, in the emitter layer region 18, or between the base and emitter layer regions 14, 18, where the region 20 of insulating material extends laterally along a fraction w of a width W of the base and emitter layer regions 14, 18 to reduce an effective width ew of the bipolar transistor to thereby eliminate or at least reduce any base push out or Kirk effects that could otherwise occur. If the base and emitter layer regions 14, 18 have different widths or have different lateral extensions, the insulating region 20 extends preferably along a fraction w of a width, along which both the base and emitter layer regions 14, 18 extend.

The insulating region 20, which may be referred to as an emitter-base junction spacer, is located in the emitter window to narrow the effective width of the emitter. The insulating region 20 shall thus not be mixed up with the patterned and etched silicon dioxide layer typically formed on top of the extrinsic base, which in deed by an opening therein defines the emitter window. The insulating region 20 will prevent unnecessary current in the base/emitter that is only contributing to the base push out or Kirk effect.

Preferably, the fraction w, along which the insulating region 20 is extending laterally, is at least a fifth, more preferably at least a third, still more preferably at least half, and yet more preferably at least two thirds of the width W of the base and emitter layer regions 14, 18, or of the width of the overlap of the base and emitter layer regions 14, 18.

If the insulating region 20 is provided within the base layer region 14, it is preferably located at a distance from the emitter layer region 18, which is less than about half the thickness $T_B$ of the base layer region 14. Similarly, if the insulating region 20 within the emitter layer region 18, it is preferably located at a distance from the base layer region 14, which is less than about half the thickness $T_E$ of the emitter layer region 18. Generally, the distance from the base-emitter interface, at which the insulating region 20 can be located, depends on the doping concentrations of the base and emitter layer regions 14, 18.

If the entire insulating region 20 is located in the emitter region 18 the intended operation will be achieved if the lower insulating region 20 boundary (towards the base) is not too far away from the base-emitter junction. If so is the case, the doped silicon between the insulating region 20 and the base-emitter junction will act as an emitter and if the corresponding doping is high enough the transistor will conduct an undesired current below the insulating region 20.

If the entire insulating region 20 is located in the base region 14 the intended operation will also be achieved if the upper insulating region 20 boundary is not too close to the collector region 13. If so is the case, the base-emitter junction will be unchanged and the corresponding capacitance will be the same as for a conventional bipolar transistor giving no speed enhancement.

The region 20 of the insulating material will prevent unnecessary current in the base/emitter that is only contributing to the base push out effect.

It shall be appreciated that the bipolar transistor of the present invention is advantageously uniform along the length of the transistor, i.e. in a dimension orthogonal to the cross section of FIG. 1.

The bipolar transistor of the present invention can be fabricated using any SOI-based bipolar or BiCMOS process.

The region 20 of the insulating material may be an etched notch region filled with insulating material, e.g. oxide and/or nitride. The fabrication of such a notch is described in the international patent publication WO03/063224, the contents of which being hereby incorporated by reference. By using such a process the emitter layer region can be a lithographically defined region with a width comparable to the minimum feature size of the fabrication process involved, whether the region 20 of the insulating material can be a sub-lithographically defined lateral dimension, and thus the effective transistor width ew can be sub-lithographically defined.

Alternatively, the region 20 of the insulating material can be a lithographically defined region. A mask can be placed such that an edge thereof is located within the emitter/base region to etch a deposited insulating layer. Even if such placement of the mask cannot be exact, it can be located within a given distance range from e.g. one end of the emitter/base region.

Figure 4:
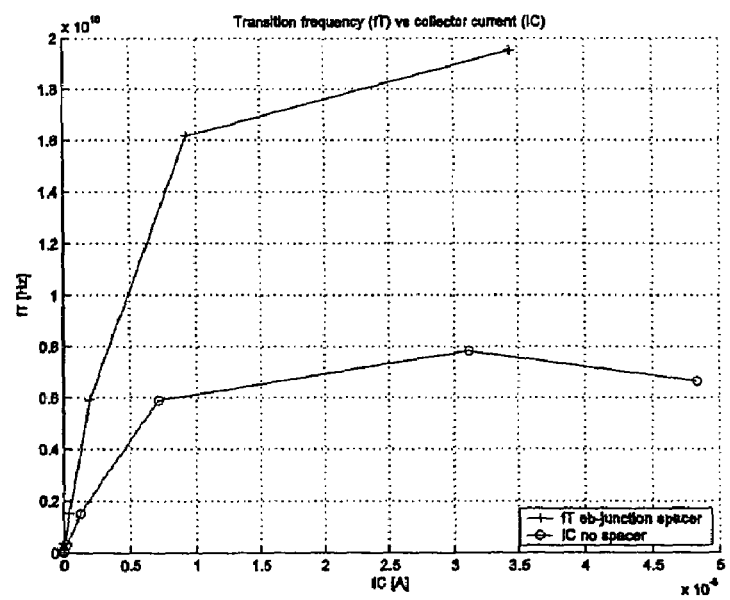
FIG. 4 is a diagram of the transition frequency versus current for the inventive bipolar transistor of FIG. 1 and for a conventional prior art bipolar transistor.

FIGS. 2-4 illustrate various transistor characteristics for an inventive bipolar transistor according to FIG. 1 and for a conventional prior art bipolar transistor to stress the improvement obtained by the bipolar transistor of the present invention. FIGS. 2a-b illustrate current flow lines for the inventive bipolar transistor of FIG. 1 (FIG. 2a), and for a conventional prior art bipolar transistor (FIG. 2b). FIG. 3 is a Gummel plot for the inventive bipolar transistor of FIG. 1 and for a conventional prior art bipolar transistor. Finally, FIG. 4 is a diagram of the transition frequency versus current for the inventive bipolar transistor of FIG. 1 and for a conventional prior art bipolar transistor.

The current flow lines show how the region 20 of the insulating material forces the current to flow closer to the edge compared to a conventional prior art transistor. The Gummel plot in FIG. 3 shows how the current for low and medium injection levels is smaller for the bipolar transistor of the present invention, simply because the area is smaller. However for high injection, the difference is vanishing. This means that the transconductance, gm, is increasing in this region for the bipolar transistor of the present invention. Also the capacitance, C, is reduced due to the presence of the region 20 of insulating material. Together this gives a higher unity gain transition frequency $f_T = g_m/(2\pi C_{be})$, where $g_m$ is the transconductance and $C_{be}$ is the base-emitter capacitance, in the critical region as evident from the diagram of FIG. 4.

Other bipolar transistors, in which the inventive region of insulating material can be formed in the base layer, in the emitter layer, or in the base-emitter interface thereof, include e.g. those described in the above-identified U.S. Pat. No. 5,087,580, and in the articles by J. Cai et al. and Q. Ouyang et al., the contents of which being hereby incorporated by reference.

It shall be appreciated that while the bipolar transistor of present invention is primarily intended for radio frequency applications, it may as well be useful for other applications in silicon or other semiconductor integrated circuits.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A monolithically integrated bipolar transistor comprising:
   an SOI substrate,
   a collector region in said SOI substrate, and
   an emitter/base region including (i) a base layer region on top of and in contact with said collector region, and (ii) an emitter layer region on top of and in contact with said base layer region, said collector, base layer, and emitter layer regions being provided with separate contact regions,
   wherein a region of an insulating material is provided in said emitter/base region, said region of said insulating material extending laterally at a fraction of a width of said emitter/base region to reduce an effective width of said bipolar transistor,
   wherein said base layer region has a thickness, and said region of said insulating material is provided within said base layer region at a distance from said emitter layer region, which is less than about half the thickness of said base layer region.

2. The bipolar transistor of claim 1, wherein said region of said insulating material is an etched region filled with said insulating material.

3. The bipolar transistor of claim 2, wherein said emitter layer region is a lithographically defined region, and said region of said insulating material has a sub-lithographically defined lateral dimension.

4. The bipolar transistor of claim 1, wherein said region of said insulating material is a lithographically defined region.

5. The bipolar transistor of claim 1, wherein said insulating material is an oxide or a nitride.

6. The bipolar transistor of claim 1, wherein said fraction, at which said region of said insulating material is extending laterally to reduce an effective width of said bipolar transistor, is at least a fifth of said width of said emitter/base region.

7. The bipolar transistor of claim 1 wherein said bipolar transistor comprises a portion of an integrated circuit.

8. The bipolar transistor of claim 1 wherein said fraction, at which said region of said insulating material is extending laterally to reduce an effective width of said bipolar transistor, is at least a third of said width of said emitter/base region.

9. The bipolar transistor of claim 1 wherein said fraction, at which said region of said insulating material is extending laterally to reduce an effective width of said bipolar transistor, is at least half of said width of said emitter/base region.

10. The bipolar transistor of claim 1 wherein said fraction, at which said region of said insulating material is extending laterally to reduce an effective width of said bipolar transistor, is at least two thirds of said width of said emitter/base region.

11. The bipolar transistor of claim 1 wherein the base layer region has a different width than the emitter layer region and the insulating layer extends along a fraction of a width along which both the base layer region and the emitter layer region extend.

12. A bipolar transistor comprising:
   an SOI substrate;
   a collector region in said SOI substrate;
   a base layer region adjacent to and in contact with said collector region;
   an emitter layer region adjacent to and in contact with said base layer region; and
   an insulating region provided at least partially in said base layer region, said insulating region extending laterally at a fraction of a width of said base layer region to reduce an effective width of said bipolar transistor.

13. The bipolar transistor of claim 12 wherein said insulating region is provided completely within said base layer region.

14. The bipolar transistor of claim 12 wherein said insulating region is further provided at least partially in said emitter layer region.

15. A bipolar transistor comprising:
   an SOI substrate;
   a collector region in said SOI substrate;
   a base layer region adjacent to and in contact with said collector region;
   an emitter layer region adjacent to and in contact with said base layer region; and
   an insulating region provided at least partially in said emitter layer region, said insulating region extending laterally at a fraction of a width of said emitter layer region to reduce an effective width of said bipolar transistor,
   wherein said insulating region is further provided at least partially in said base layer region.

* * * * *